United States Patent
Ryan

(10) Patent No.: US 6,725,319 B2
(45) Date of Patent: *Apr. 20, 2004

(54) MEMORY DEVICE INTERFACE MEMORY TRANSLATOR HUB

(75) Inventor: Kevin J. Ryan, Eagle, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/238,117

(22) Filed: Sep. 10, 2002

(65) Prior Publication Data

US 2003/0018848 A1 Jan. 23, 2003

Related U.S. Application Data

(63) Continuation of application No. 09/258,466, filed on Feb. 26, 1999, now Pat. No. 6,449,679.

(51) Int. Cl.[7] ............................................. G06F 13/36
(52) U.S. Cl. ...................................... 710/315; 711/154
(58) Field of Search ............................... 711/105, 154; 710/107, 127, 129, 315

(56) References Cited

U.S. PATENT DOCUMENTS

| | | | |
|---|---|---|---|
| 5,748,635 A | 5/1998 | Thomann et al. | 370/465 |
| 5,862,154 A | 1/1999 | Pawlowski | 371/40.11 |
| 5,909,701 A | 6/1999 | Jeddeloh | 711/167 |
| 5,926,838 A | 7/1999 | Jeddeloh | 711/167 |
| 5,933,859 A | 8/1999 | Klein | 711/211 |
| 5,935,263 A | 8/1999 | Keeth et al. | 714/718 |
| 5,954,808 A | 9/1999 | Paul | 710/104 |
| 6,047,361 A | 4/2000 | Ingenio et al. | 711/167 |
| 6,108,730 A | 8/2000 | Dell et al. | 710/102 |
| 6,449,679 B2 * | 9/2002 | Ryan | 710/315 |

OTHER PUBLICATIONS

"Intel Offers SDRAM Alternative to Rambus on Camino Chipsets", *Computergram International*, (Jul. 14, 1999), 1 p.
"SDRAM to Direct RDRAM", *Intel Development Forum Presentation*, Presentation Materials, (Undated).
Carroll, M.., "Compaq, IBM, Others Seek Memory alternatives for Tanner–and Merced–class Systems—Intel Preps Direct Rambus for Servers", *Electronic Engineering Times*, (Aug. 17, 1998), p. 1.
Hachman, M.., et al. , "Intel Simplifies Transition to New MPUs, Chipsets", *Electronic Buyers News*, (Dec. 7, 1998), p. 1.

* cited by examiner

Primary Examiner—David L. Robertson
(74) Attorney, Agent, or Firm—Schwegman, Lundberg, Woessner & Kluth, P.A.

(57) ABSTRACT

An interface device provided on a motherboard, or with a memory control chip set, translates between a controller, intended to communicate with a packet based memory system, and a non-packet based memory system. Communications from a memory controller, intended to directly communicate with a RAMBUS RDRAM memory system, are translated for a memory system which does not comprise RAMBUS RDRAM. The interface device, or integrated circuit, is not located with the memory system. That is, the memory modules do not include the interface circuit. Instead, the interface device is located with the processor motherboard, or with the controller/bridge integrated circuit chip set, such that it is electrically located between a controller and main memory sockets.

24 Claims, 6 Drawing Sheets

MEMORY DEVICE INTERFACE MEMORY TRANSLATOR HUB

This application is a Continuation of U.S. application Ser. No. 09/258,466, filed Feb. 26, 1999, now U.S. Pat. No. 6,449,679 which is incorporated herein by reference.

TECHNICAL FIELD OF THE INVENTION

The present invention relates generally to processing systems and in particular the present invention relates to a memory interface which allows interchangablity of multiple memory devices.

BACKGROUND OF THE INVENTION

A memory device is the place where a computer processor holds current programs and data that are in use, and, because of the demands made by increasingly powerful software, system memory requirements have been accelerating at an alarming pace over the last few years. The result is that modern computers have significantly more memory than the first computers of the early 1980s, and this has had an effect on development of processor architectures. Storing and retrieving data from a large block of memory is more time-consuming than from a small block. With a large amount of memory, the difference in time between a register access and a memory access is very great, and this has resulted in extra layers of 'cache' memory in the storage hierarchy. When it comes to access speed, processors are currently outstripping memory chips by an ever-increasing margin.

System memory can comprise different types of memory. Synchronous dynamic random access memory (SDRAM) is a type of DRAM that can run at much higher clock speeds than conventional memory. The SDRAM synchronizes itself with a central processing unit's (CPU) bus and is capable of running at speeds of about 100 MHZ, about three times faster than conventional fast page mode (FPM) DRAM, and about twice as fast as extended data output (EDO) DRAM and burst EDO DRAM. SDRAM, therefore, is replacing EDO DRAM in many newer computers Today's fastest processing systems use CPU buses running at, or in excess of, 100 MHZ, so SDRAM can marginally maintain the bus speed. Future processing systems, however, are expected to have CPU buses running at 200 MHZ or faster. SDRAM is not expected to support these high speeds which is why new memory technologies are being developed.

RAMBUS DRAM (RDRAM) is a type of memory developed by RAMBUS, Inc., Mountain View, Calif. It is anticipated that RDRAM can transfer data at up to 600 MHZ. RDRAM is being used in place of video RAM (VRAM) in some graphics accelerator boards, but it is not expected to be used for the main memory of processing systems until 1999.

Both the cost and availability of RDRAM creates a barrier to widespread use of the memory in processing systems. Thus, processors developed which are designed to communicate with RDRAM may not experience widespread acceptance until RDRAM is economically available. For the reasons stated above, and for other reasons stated below which will become apparent to those skilled in the art upon reading and understanding the present specification, there is a need in the art for an apparatus and method which allows a processing system, originally designed to use RDRAM, to use more economical memory devices.

SUMMARY OF THE INVENTION

In one embodiment, a processing system comprises a memory controller adapted to communicate using a packet based RDRAM protocol, a memory module comprising SDRAM devices, and an interface device located with the memory controller such that the interface device is not located on the memory module. The interface device translates packet based RDRAM protocol command and data signals from the memory controller into an SDRAM protocol, and the interface device translates data signals received from the memory module into packet based RDRAM protocol data.

In another embodiment, a processing system comprises a memory controller adapted to communicate using a packet based RDRAM protocol, a memory module comprising SDRAM devices, the memory module is located in a memory socket, and an interface device located between the memory controller and the memory socket. The interface device translates packet based RDRAM protocol command and data signals from the memory controller into an SDRAM protocol, and the interface device translates data signals received from the memory module into packet based RDRAM protocol data.

In still another embodiment, a processing system comprises a memory controller adapted to communicate using a packet based RDRAM protocol, and a memory module comprising SDRAM devices. The memory module is located in a memory socket. An interface device is located between the memory controller and the memory socket. The interface device translates packet based RDRAM protocol command and data signals from the memory controller into an SDRAM protocol. The interface device comprises a write demultiplex circuit for converting data received on N data lines from the memory controller to M×N data lines, a read multiplex circuit converting received on the M×N data lines from the memory module to the N data lines, and a command disassembler for converting packet based commands from the memory controller into row/column based commands.

DETAILED DESCRIPTION OF THE INVENTION

Figure 1:
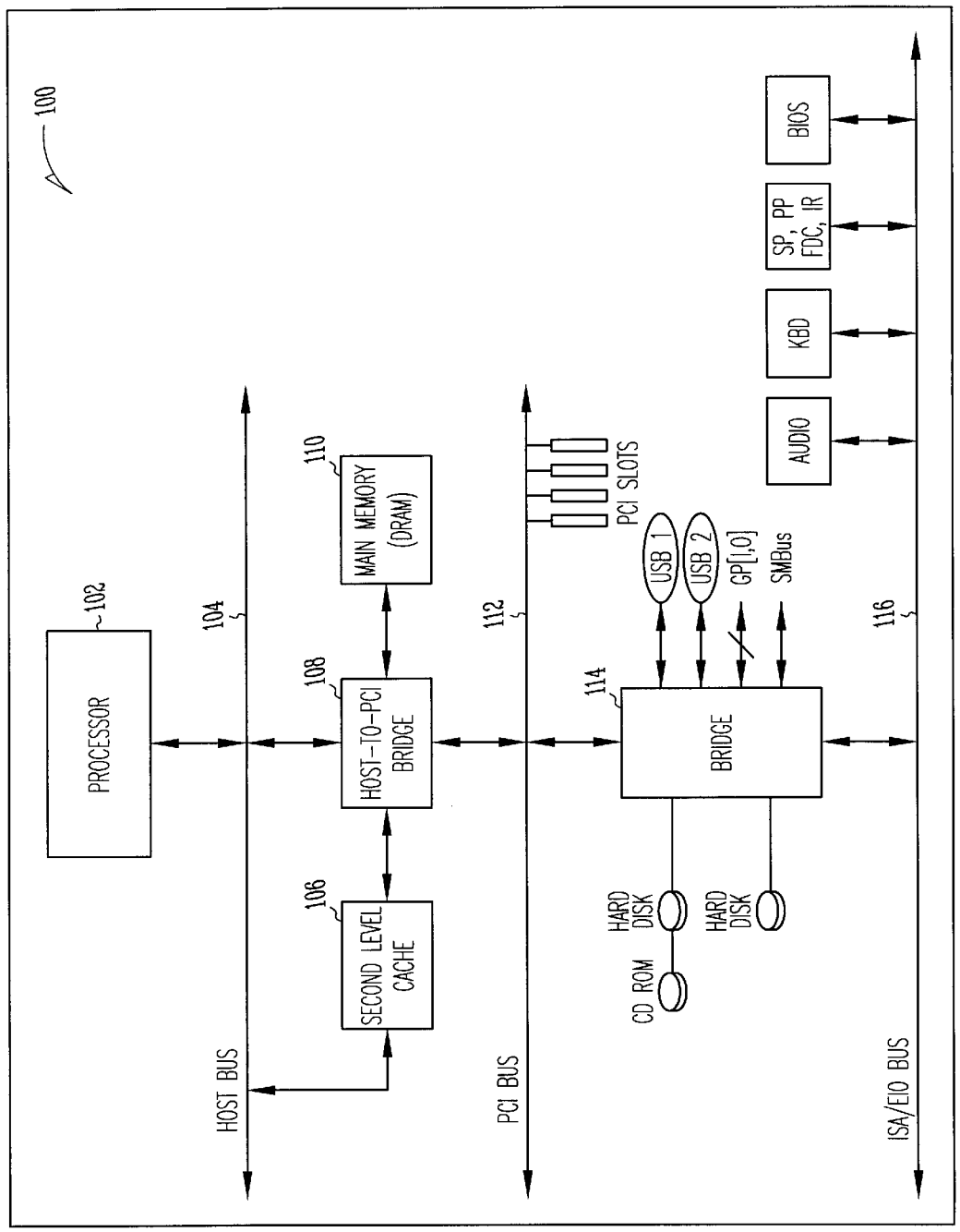
FIG. 1 is a prior art processing system.

In the following detailed description of the preferred embodiments, reference is made to the accompanying drawings which form a part hereof, and in which is shown by way of illustration specific preferred embodiments in which the inventions may be practiced. These embodiments are described in sufficient detail to enable those skilled in the art to practice the invention, and it is to be understood that other embodiments may be utilized and that logical, mechanical and electrical changes may be made without departing from the spirit and scope of the present inventions. The following detailed description is, therefore, not to be taken in a limiting sense, and the scope of the present invention is defined only by the appended claims.

A variety of memories can be used in processing systems. For example, one processing system can use three levels of memory. A primary cache, or 'Level 1' cache, can be located on a processor, or CPU, and is used for temporary storage of instructions and data. Primary cache tends to be the fastest form of storage, but is limited in size due to its location on the processor integrated circuit chip.

Most processing systems are offered with a secondary cache to bridge the processor/memory performance gap. Secondary cache (also know as 'external' or 'Level 2' cache) uses the same control logic as primary cache and can be implemented using static random access memory (SRAM). The secondary cache is intended to supply information to the processor without any delay (wait-state).

The third and principal level of the system memory is referred to as main memory, or RAM. The main memory operates as a staging area between a hard disk and the processor. Typically, the more data available in the RAM, the faster the processor can operate. Main memory is attached to the processor via address and data buses.

As stated above, RAMBUS Inc. has developed a memory referred to as a RAMBUS DRAM (RDRAM) which can operate at bus communication speeds in excess of 100 MHZ. The RAMBUS design centers on a high-speed interface that transfers data over an 8-bit bus referred to as a RAMBUS Channel. The RDRAM system uses a two-channel configuration with one 2 MB×8 RDRAM per channel, for memory granularity of 4 MB. Each pair of RDRAMs has an effective 16-bit data path and presents two 4K open pages to a memory controller.

A synchronous DRAM system, in contrast, can use four 1 MB×16 SDRAM chips sharing a common address/control bus with a memory granularity of 8 MB. This 64-bit data path presents two 2K pages to the memory controller. Both RDRAM and SDRAM designs use the same core technology. Thus, the fundamental device timings are basically the same. The speed at which these devices move address and control information to the memory controller is different. The RAMBUS system, oscillating at 533 MHZ internally, transmits data every 3.75 ns, which is four times faster than a 66 MHZ system bus clock rate of 15 ns. This translates into an RDRAM-based system needing eight CPU clock cycles to move 32 bytes of data versus 10 CPU clock cycles for an SDRAM-based system.

Using RDRAM, a memory controller can latch a valid memory address and read request from the CPU at clock cycle zero. The RDRAM device latency from the start of the command to the first byte of data returning from the RDRAM is five CPU clock cycles. The RAMBUS clock cycles four times within the next CPU clock cycle, and the two RDRAMs transfer 16 bytes of data (4 bytes per RAMBUS cycle) to the memory controller. With the seventh CPU clock cycle, the two RDRAMs transfer another 16 bytes of data. By the eighth CPU clock cycle, the RDRAM-based system moves 32 bytes of data to the memory controller.

Referring to FIG. 1, a Prior Art processing system 100 is described. The system includes a processor 102 coupled to a host bus 104. The host bus allows communication with a second level cache 106 and memory controller 108. The memory controller can access either the cache memory or main memory 110. The controller also functions as a bridge between the host bus and a second bus 112, such as a peripheral component interconnect (PCI) bus. The PCI bus is a 64-bit bus which can run at clock speeds of 33 or 66 MHZ. This bridge is sometimes referred to as a north bridge. A second bridge 114 can be provided to allow communication with another bus 116, such as an industry standard bus (ISA). This bridge, sometimes referred to as a south bridge, also allows access to integrated drive electronics (IDE) ports, universal serial bus (USB), and other devices.

The main memory typically comprises random access memory devices. The random access memory can be such as fast page mode (FPM) RAM, extended data output (EDO) DRAM, burst EDO DRAM, or synchronous dynamic random access memory (SDRAM). These types of memory are traditionally coupled to the memory controller using an in-line memory module as known to those in the in the art. The in-line memory modules can be configured as either a single in-line memory module (SIMM) or a dual in-line memory module (DIMM) which is physically inserted into a corresponding memory slot.

As explained above, RAMBUS Inc. provides a random access memory referred to as a RDRAM which can be used as main memory. The RDRAM can be provided as an in-line memory module, referred to a RAMBUS in-line memory module (RIMM). If an RDRAM based main memory is provided in processing system 100, the memory controller 108 must be configured to communicate using an RDRAM protocol. The RDRAM protocol is based on packets, not the conventional multiplexed row/column random access memory protocol. As stated above, a memory controller, or bridge, which is designed to directly communicate with RDRAM cannot be commercially exploited until RAMBUS memory is cost competitive with a plentiful supply.

It has been proposed in the prior art to provide in-line memory modules which include SDRAM devices in place of RDRAM devices. Each memory module would have an integrated circuit interface chip which allows the memory module to be placed in a RIMM socket for communication with a controller configured for communication with a RAMBUS Inc. memory. This proposition, therefore, requires an interface device to be provided with each memory module.

Because different SDRAM memories are currently available, the memory module interface device is not desired. These different SDRAM devices include, but are not limited to, SDR SDRAM, DDR SDRAM, and DDR SGRAM. The SDR SDRAM is a single data rate SDRAM that supports data transfers on one edge of each clock cycle. The DDR SDRAM is a double data rate SDRAM that supports data transfers on both edges of each clock cycle, effectively doubling the memory chip's data throughput. The DDR-SDRAM is also called SDRAM II. The DDR SGRAM is a double data rate synchronous graphics RAM. Each of these memories communicate using a row/column protocol and either low voltage transistor-transistor logic (LVTTL) or SSTL_2.

Figure 2:
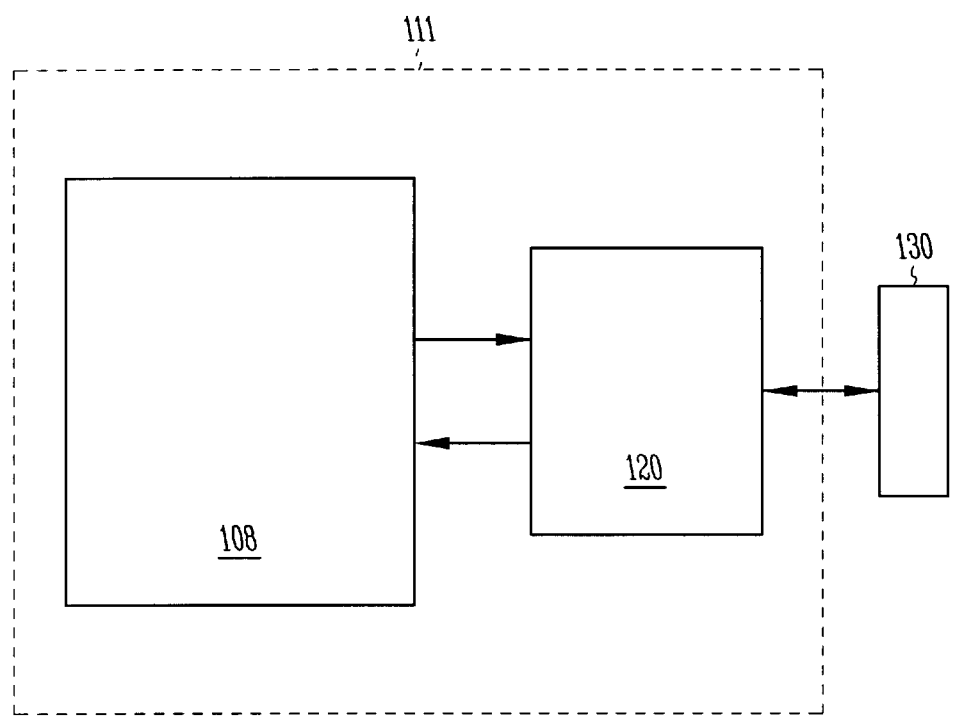
FIG. 2 illustrates a processing system having an interface device of the present invention.

FIG. 2 illustrates a processing system which has an interface device 120 located in a processing system to translate between a memory controller 108 and a non-packet based main memory located in memory module sockets 130. The controller, which can be provided as a chip set or on a mother board, is adapted to communicate using a packet-based protocol. The interface device translates the packet-based protocol into a row/column protocol. In contrast to the proposed system, a single interface device 120 is required in the processing system.

Figure 3:
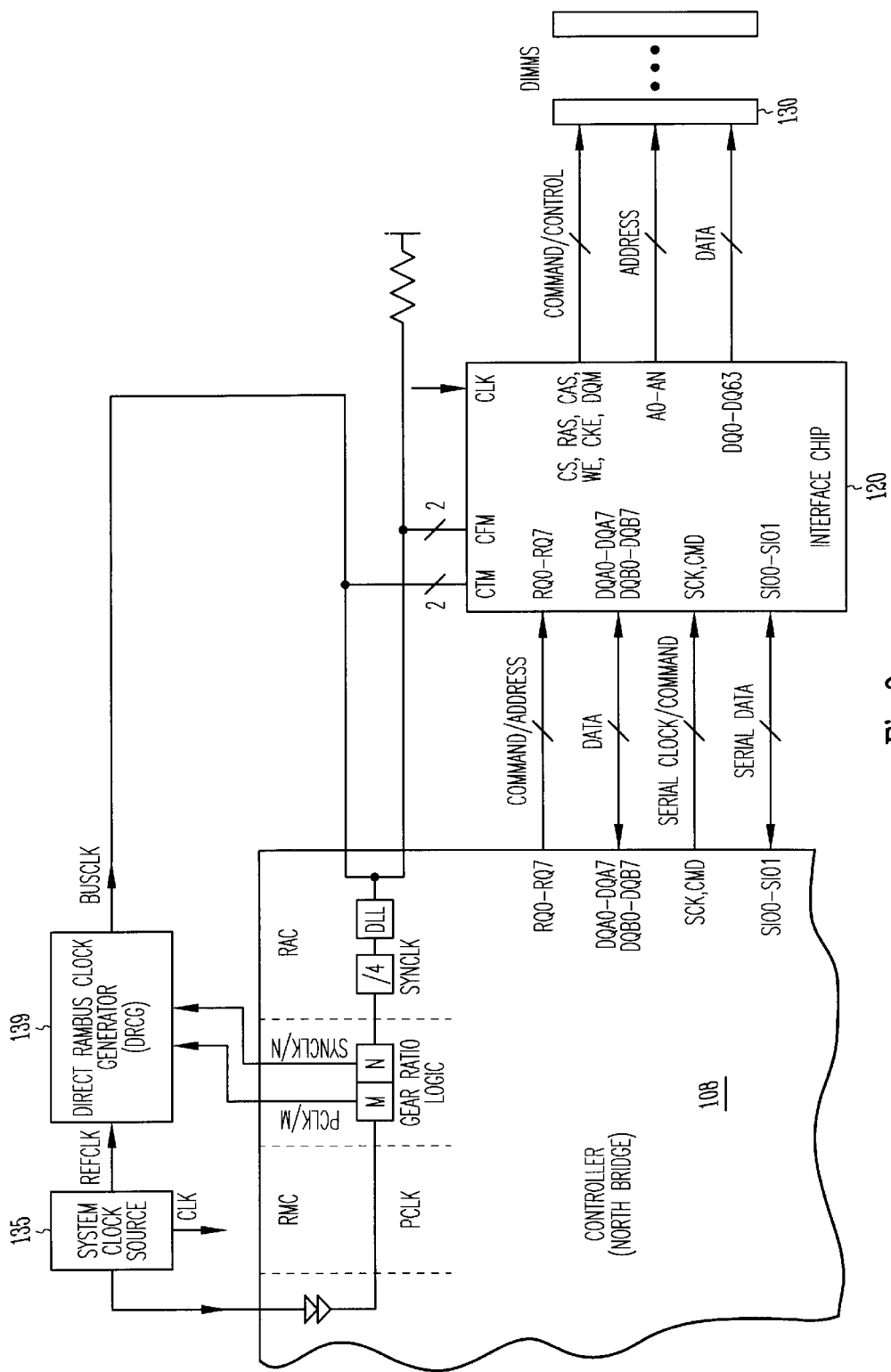
FIG. 3 illustrates one embodiment of an interface device of FIG. 2.
Figure 4:
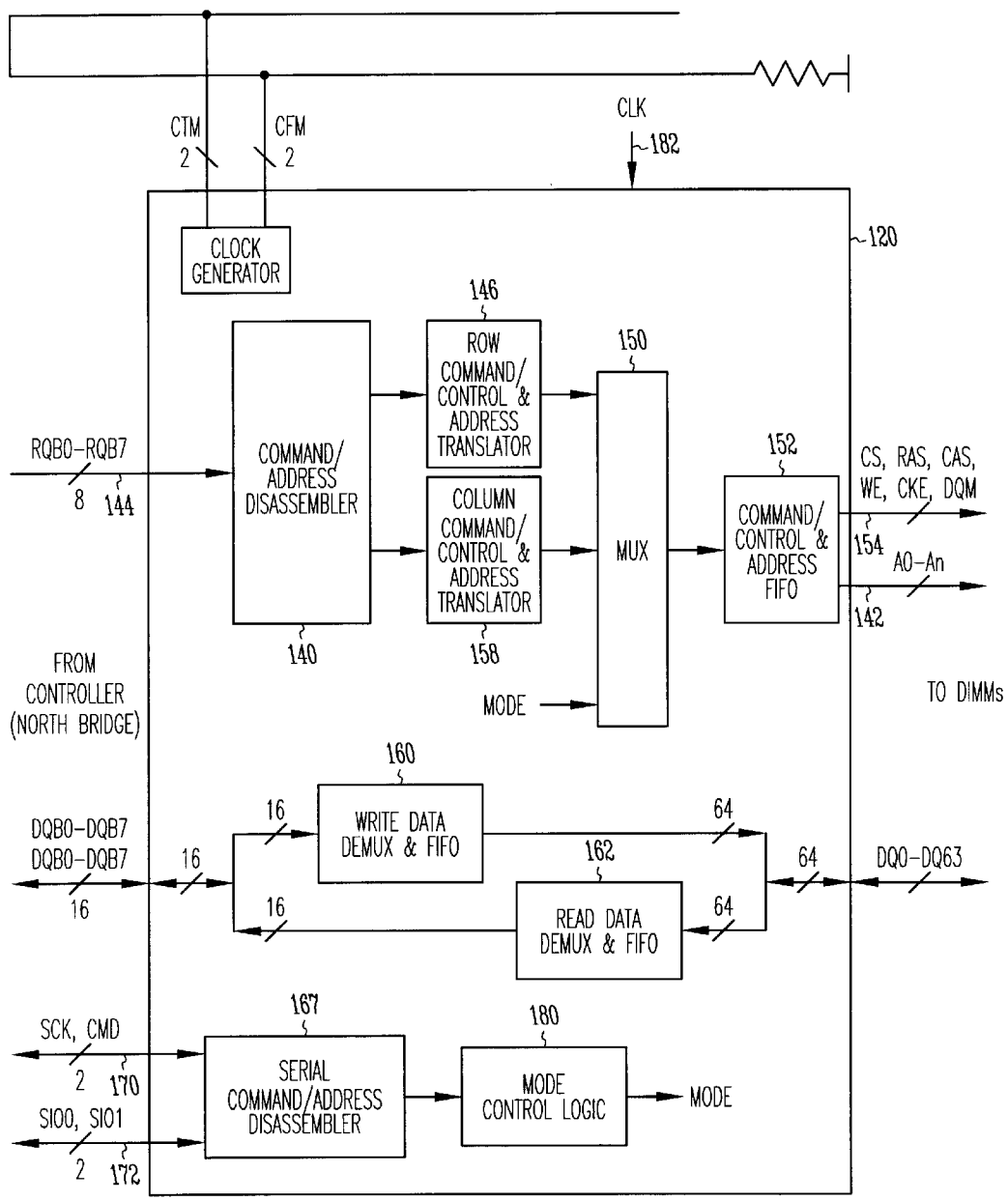
FIG. 4 illustrates one embodiment of an interface device of FIG. 2.

FIGS. 3 and 4 illustrates one embodiment of the interface device. The interface device 120 is an integrated circuit package having a plurality of external communication and control nodes, or connections. The interface device includes CTM, CFM, CLK, command/control, A0–An, DQ0–DQ63, SIO0 and SIO1 (serial data), SCK (serial clock), CMD (command), DQA0–DQA7, DQB0–DQB7, and RQ0–RQ7

(request) connections. The command/control connections may include CS, RAS, CAS, WE, CKE and DQM. The following provides a description of the interface device connections.

The CTM connection receives a Clock to Master signal, and the CFM connection receives a Clock from Master signal. The RAMBUS memory sub-systems use a looped-back clock trace on a circuit board, and each device is connected to the trace at two points. A system clock 135 and direct RAMBUS clock generator 139 are also provided.

Bank and Row addresses provided by the memory controller 108 are converted to SDRAM address space using a command/address disassembler 140 (SDRAMs typically have fewer banks and more rows than RDRAM, so one approach is to convert bank address bits to row address bits). The controller needs to know that this conversion is taking place (i.e., that the system is populated with SDRAMs, not RDRAMs) and must avoid opening more than one row in a given group of direct RDRAM bank addresses (that will map to a single SDRAM bank). The controller can determine memory type and characteristics by reading the serial presence detect (SPD) ROM devices located on SDRAM DIMMs via the "South Bridge." For example using an INTEL 82371AB PCI-to-ISA/IDE Xcelerator. The translated SDRAM address signals are transmitted on the A0–An outputs 142 to the main memory.

To facilitate the translation, ROW0–ROW2 signals comprise 3 pins of the RQ0–RQ7 inputs 144 to the interface device. These three signals provide 24 bits of information (3×8 ticks=24 bits) which contain Row operation (command), Row address, Bank address and Device address information. Using a translator circuit 146, the Device address is decoded to drive a specific chip select (CS) signal. Likewise, the Row Command is converted to an equivalent SDRAM command (e.g., Active, Precharge, etc.) and is forwarded in sequence. In one embodiment, the row command is forwarded first and the column command second. The SDRAM Command is transmitted using multiplex circuit 150 and FIFO circuit 152 via CS, RAS, CAS, WE, CKE outputs 154 and one or more Address outputs (A0–An). The number of address lines, and the number of copies of each command or address line is determined by the maximum memory configuration supported. This embodiment of the interface chip provides the same communication interface on the memory side as conventional SDRAM North Bridge chips.

A similar column address translation is provided using translator circuit 158. The Column Command is converted to an equivalent SDRAM command (e.g., Read, Write, etc.) and is forwarded in sequence (on the signals as described above). Write commands are stored until the corresponding data and mask bits are received, and then all are forwarded together. Write mask bits are converted to DQM bits and, as mentioned, are sent with the corresponding data bits and command. DQM bits are transmitted via the DQM outputs (1 logical DQM per byte of data, could be more physical DQMs for loading reasons, a byte could be 8 or 9 bits). Thus, COL0–COL4 signals are provided on five pins of the RQ0–RQ7 connections to provide 40 bits (5×8 ticks=40 bits) which contain Column operation (command), Bank address, Device address and Write Mask Bits.

Incoming data for write operations is captured on DQA0–DQA7, and DQB0–DQB7 (2 bytes) on each of 8 ticks (edges of CFM). The data is demultiplexed using circuit 160, regrouped and forwarded on DQ0–DQ63 (8 bytes) on each of two positive edges of CLK (for DDR, two edges of one CLK cycle). Sixteen data connections are provide, however, other bandwidths can be supported, such as eighteen. For read operations, data received from the SDRAMs (on DQ0–DQ63) on two CLK edges is multiplexed out on DQA0–DQA7 using circuit 162, and DQB0–DQB7 on each of 8 edges of CTM.

In a direct RDRAM based system, the Serial Clock/Command 170 and Serial Data signals 172 are used to program registers and/or operating modes in RDRAMs. SDRAMs are much less complex in this area (a single mode register for SDR SDRAMs, two mode registers for DDR SDRAMs). These signals can be used, in one embodiment, to instruct the interface device to program the SDRAM mode registers and/or provide the information that is to be programmed. Thus, a disassembler circuit 167 and mode control logic 180 provided to control multiplex circuit 150.

A clock signal 182 is provided to the interface device by a separate clock source 135, a copy(s) of this signal is provided to the main memory, SDRAM DIMMs. This signal (CLK) is the signal to which the SDRAM timing is referenced.

Figure 5:
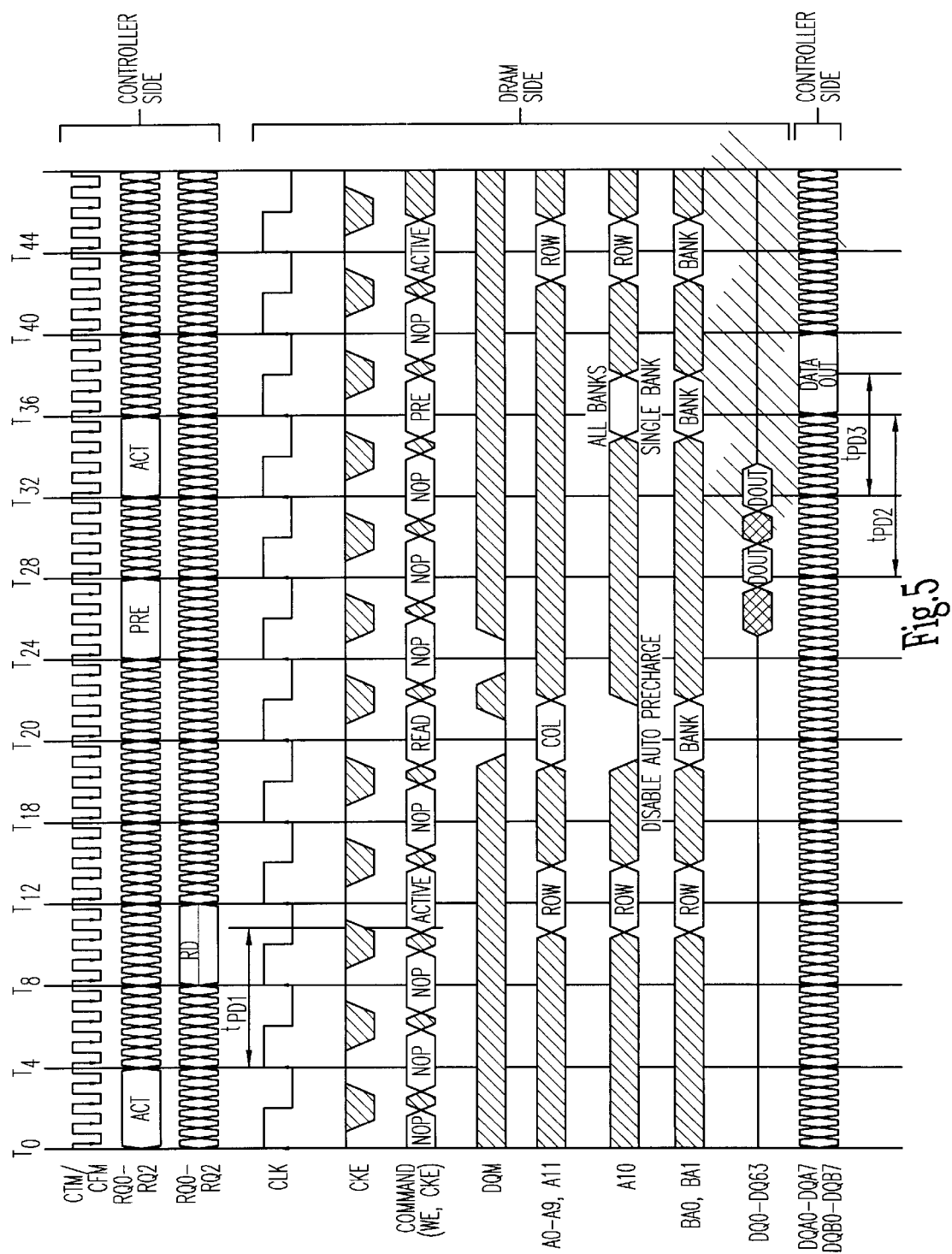
FIG. 5 is a timing diagram of a read operation.

Referring to FIG. 5, one example of read timing is provided. During a read operation, the controller sends a read command ($T_0$–$T_4$) and address information to the interface device. The interface device translates the information and re-transmits that information to the main memory DRAMs ($T_{11}$–$T_{22}$). Again, the main memory can comprise SDRAM, SGRAM, or the like. Further, the main memory can be configured in a memory module. After the data has been accessed, the memory provides the read data to the interface device ($T_{27}$–$T_{30}$, $T_{31}$–$T_{34}$), which multiplexes the data from 64 bits down to 16 bits and provides it to the controller ($T_{36}$–$T_{40}$). Time tPD1 ($T_4$–$T_{11}$) represents the delay through the interface device (to disassemble, translate and re-transmit the command/control and address signals). Time tPD2 ($T_{28}$–$T_{36}$) is the delay through the interface device used to capture, multiplex, and queue-up the first half of the data burst. Time tPD3 ($T_{32}$–$T_{38}$)is the delay experienced to capture, mux and re-transmit the second half of the data burst. The first half of the data is delayed longer than the second half (tPD2>tPD3) so that both halves can be output in a contiguous burst.

Figure 6:
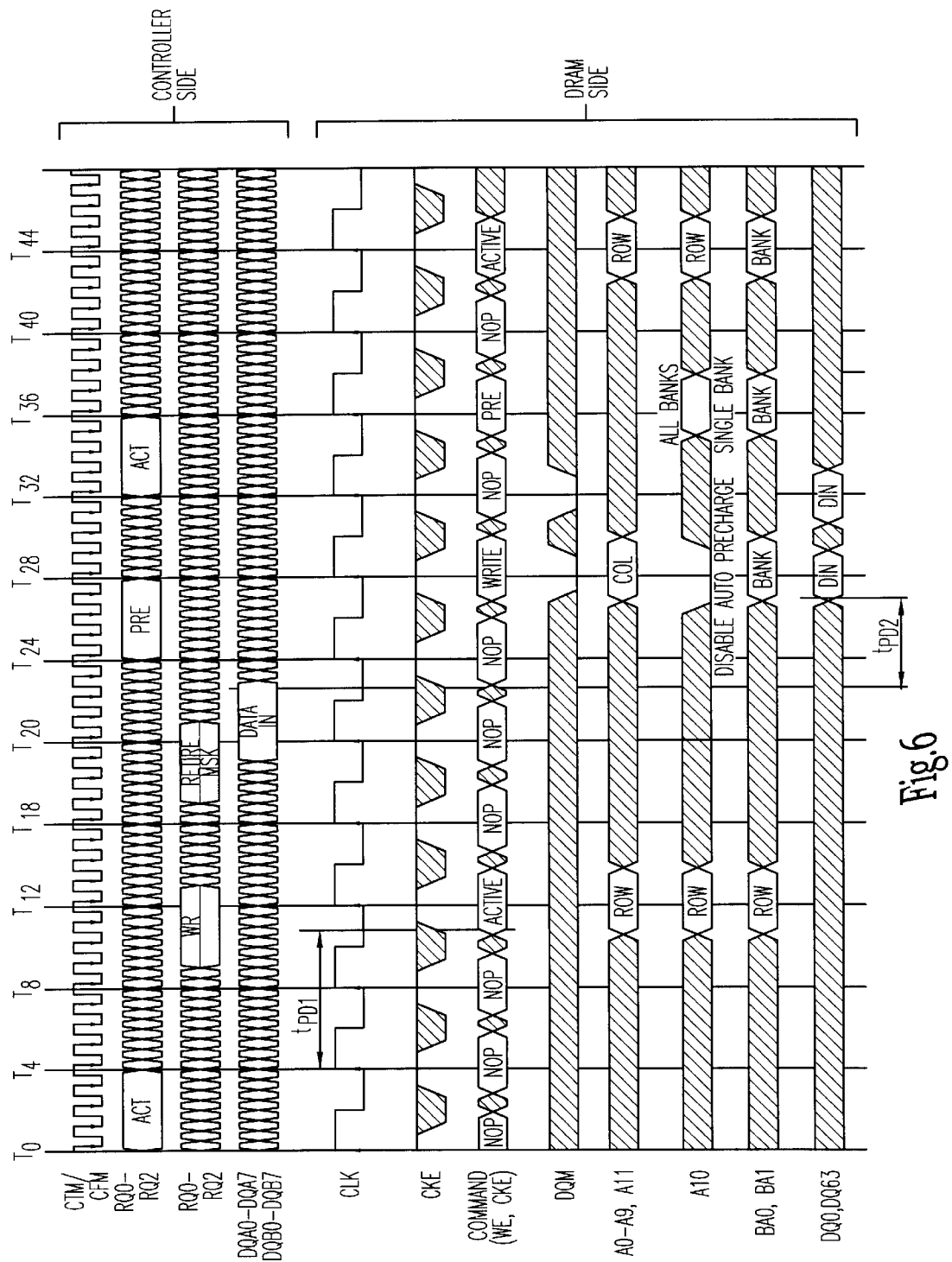
FIG. 6 is a timing diagram of a write operation.

Referring to FIG. 6, one example of write timing is provided. During a write operation, the controller sends a write command and address information ($T_0$–$T_4$) to the interface device. Optional mask data can be provided by the controller ($T_{18}$–$T_{22}$). Finally, the data to be written to the memory is provided ($T_{19}$–$T_{23}$). The interface device translates the command and address information and stores it until the mask and data are received. If mask data is provided, the interface device translates it to DQMs and stores these until data is received. Once the corresponding data is received, it is demultiplexed and then command, address, mask and write data are all transmitted to the memory. Time tPD1 ($T_4$–$T_{11}$) represents the delay through the interface device experienced to disassemble, translate and re-transmit the command/control and address signals for commands other than write commands. Time tPD2 ($T_{23}$–$T_{27}$) represents the delay through the interface device experienced between receiving the write data and re-transmitting the write data along with the command and mask data that was previously received and translated.

An interface device has been described which is provided on a motherboard, or with a memory control chip set, to translate between a controller, which is intended to communicate with a packet based memory system, and a non-packet based memory system. In particular, communications from a memory controller, intended to directly communicate with a RAMBUS RDRAM memory system, are translated for a memory system which does not comprise RAMBUS RDRAM. The interface device, or integrated circuit, is not located with the memory system. That is, the memory modules do not include the interface circuit. Instead, the interface device is located with the processor motherboard, or with the controller/bridge integrated circuit chip set, such that it is electrically located between a controller and main memory sockets. By providing the interface device at the controller side of the communication bus, the system is flexible and the cost of the memory modules is not adversely effected.

The interface chip can support either matched or unmatched input and output bandwidth. For example, a controller-memory interface that is 800 MHZ (800 Mbps per pin) and 16-bits wide has a peak bandwidth of 1.6 Gigabytes-per-second (Gbps). This matches 1:1 with a 64-bit wide DDR SDRAM interface running at a 200 MHZ data rate. However, this is a 2:1 unmatched relationship with a 100 MHZ SDR SDRAM, and a 1.5:1 relationship with a 133 MHZ SDR. Alternately, if the controller-memory interface is 600 MHZ and 16-bits wide, or 1.2 Gbps, it has a 1.5:1 relationship with a 133 MHZ SDR, and a 0.75:1 relationship with a 200 MHZ DDR. The interface chip, therefore, operates with either matched or unmatched bandwidth to support both SDR and DDR memories. For unmatched bandwidth, the FIFO buffers 160 and 162 can be deeper than in matched applications. This provides a better buffer for receiving fast data, and allows an accumulation of slower data.

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. Therefore, it is manifestly intended that this invention be limited only by the claims and the equivalents thereof.

What is claimed is:

1. A processing system comprising:
   a memory controller adapted to issue and receive commands in a packet based RDRAM protocol;
   a cache memory;
   a plurality of memory modules comprising SDRAM devices; and
   a single interface device located with the memory controller such that the interface device is not located on the memory modules, the interface device adapted to translate packet based RDRAM protocol command and data signals from the memory controller into an SDRAM protocol, and the interface device adapted to translate data signals received from the memory module into packet based RDRAM protocol data.

2. The processing system of claim 1 wherein the memory controller is provided in an integrated circuit chip set.

3. The processing system of claim 2 wherein the integrated circuit chip set comprises the single interface device.

4. The processing system of claim 1 wherein the memory controller and single interface device are provided on a motherboard.

5. A processing system comprising:
   a memory controller adapted to issue and receive commands in a packet based RDRAM protocol;
   a cache memory;
   a plurality of memory modules comprising SDRAM devices, the plurality of memory modules each being located in a memory socket; and
   a single interface device located between the memory controller and the memory sockets, the interface device adapted to translate packet based RDRAM protocol command and data signals from the memory controller into an SDRAM protocol, and the interface device adapted to translate data signals received from the memory module into packet based RDRAM protocol data.

6. The processing system of claim 5 wherein the memory controller and single interface device are provided on a motherboard.

7. The processing system of claim 5, wherein the single interface device supports either matched or unmatched data input and output bandwidth.

8. The processing system of claim 5 wherein the single interface device comprises:
   a write demultiplex circuit adapted to convert data received on N data lines from the memory controller to M×N data lines;
   a read multiplex circuit adapted to convert received data on the M×N data lines from the memory module to the N data lines; and
   a command disassembler adapted to convert packet based commands from the memory controller into row/column based commands.

9. A processing system comprising:
   a memory controller adapted to issue and receive commands in a packet based RDRAM protocol;
   a cache memory;
   a plurality of memory modules comprising SDRAM devices, the plurality of memory modules each being located in a memory socket; and
   a single interface device located between the memory controller and the memory sockets, the interface device adapted to translate packet based RDRAM protocol command and data signals from the memory controller into an SDRAM protocol, the interface device comprises:
   a write demultiplex circuit adapted to convert data received on N data lines from the memory controller to M×N data lines;
   a read multiplex circuit adapted to convert received data on the M×N data lines from the memory module to the N data lines; and
   a command disassembler adapted to convert packet based commands from the memory controller into row/column based commands.

10. The processing system of claim 9, wherein the memory controller and single interface device are provided on a motherboard.

11. The processing system of claim 9, wherein the single interface device supports either matched or unmatched data input and output bandwidth.

12. The processing system of claim 9, wherein the memory controller is provided in an integrated circuit chip set.

13. The processing system of claim 12, wherein the integrated circuit chip set comprises the single interface device.

14. A processing system comprising:
   a memory controller adapted to issue and receive commands in a packet based RAMBUS DRAM protocol;
   a cache memory;
   a plurality of memory modules each comprising column/row protocol based DRAM devices, the memory modules are located in in-line memory module sockets; and a single interface device located between the memory controller and the in-line memory module sockets, the interface device adapted to translate packet based RAMBUS DRAM protocol command and data signals from the memory controller into the column/row protocol, and the interface device adapted to translate data signals received from the memory modules into packet based RAMBUS DRAM protocol data.

15. The processing system of claim 14, wherein the memory controller is provided in an integrated circuit chip set.

16. The processing system of claim 15, wherein the integrated circuit chip set comprises the single interface device.

17. The processing system of claim 14, wherein the memory controller and single interface device are provided on a motherboard.

18. A processing system motherboard comprising:
   a memory controller adapted to issue and receive commands in a packet based RDRAM protocol;
   a cache memory; and
   a single interface device adapted to translate packet based RDRAM protocol command and data signals from the memory controller into a column/row DRAM protocol, and adapted to translate data signals received from a plurality of memory modules that are located external to the motherboard into the packet based RDRAM protocol data.

19. The processing system motherboard of claim 18, further comprising a processor.

20. The processing system motherboard of claim 18, wherein the column/row DRAM protocol is a column/row SDRAM protocol.

21. A processing system comprising:
   a processor; and
   a chip set, comprising:
      a memory controller adapted to issue and receive commands in a packet based RDRAM protocol;
      a cache memory coupled to the processor, and
      a single interface device adapted to translate packet based RDRAM protocol command and data signals from the memory controller into a column/row DRAM protocol, and adapted to translate data signals received from a plurality of memory modules, each of the memory modules being separately detachable from the interface device into the packet based RDRAM protocol data.

22. The processing system chip set of claim 21, wherein the single interface device comprises:
   a write demultiplex circuit adapted to convert data received on N data lines from the memory controller to M×N data lines;
   a read multiplex circuit adapted to convert received data on the M×N data lines from an external memory to the N data lines; and
   a command disassembler adapted to convert packet based RDRAM commands from the memory controller into the row/column DRAM commands.

23. A processing system comprising:
   a processor;
   a cache memory coupled to the processor;
   a plurality of memory modules comprising SDRAM devices, the plurality of memory modules each being located in a memory socket;
   a chip set, comprising:
      a memory controller adapted to issue and receive commands in a packet based RDRAM protocol; and
      a single interface device located between the memory controller and the memory sockets, the interface device adapted to translate packet based RDRAM protocol command and data signals from the memory controller into an SDRAM protocol.

24. The processing system of claim 23 wherein the memory controller and single interface device are provided on a motherboard.

* * * * *

UNITED STATES PATENT AND TRADEMARK OFFICE
CERTIFICATE OF CORRECTION

PATENT NO. : 6,725,319 B2
DATED : April 20, 2004
INVENTOR(S) : Ryan

It is certified that error appears in the above-identified patent and that said Letters Patent is hereby corrected as shown below:

<u>Title page, Item [54] and Column 1, line 1,</u>
After "MEMORY DEVICE INTERFACE" delete "MEMORY TRANSLATOR HUB".

<u>Column 1,</u>
Line 10, delete "interchangablity" and insert -- interchangeability --, therefor.

<u>Column 9,</u>
Line 26, delete "a" and insert -- the --, therefor.

<u>Column 10,</u>
Line 5, "delete "a" and insert -- the --, therefor.

Signed and Sealed this

Twenty-second Day of June, 2004

JON W. DUDAS
*Acting Director of the United States Patent and Trademark Office*